United States Patent
Sorg et al.

(10) Patent No.: US 11,490,058 B2
(45) Date of Patent: Nov. 1, 2022

(54) OPTOELECTRONIC LIGHT SOURCE AND DATA GLASSES

(71) Applicant: OSRAM Opto Semiconductors GmbH, Regensburg (DE)

(72) Inventors: Jörg Erich Sorg, Regensburg (DE); Alan Lenef, Belmont, MA (US)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 43 days.

(21) Appl. No.: 17/200,068

(22) Filed: Mar. 12, 2021

(65) Prior Publication Data

US 2022/0295023 A1    Sep. 15, 2022

(51) Int. Cl.
| | | |
|---|---|---|
| G03B 21/14 | (2006.01) | |
| H04N 9/31 | (2006.01) | |
| H01S 5/02255 | (2021.01) | |
| H01S 5/00 | (2006.01) | |

(52) U.S. Cl.
CPC ....... *H04N 9/3161* (2013.01); *H01S 5/02255* (2021.01); *H04N 9/3129* (2013.01); *H01S 5/0087* (2021.01)

(58) Field of Classification Search
CPC .. H01S 5/0609; H01S 5/02461; H01S 5/4012; H01S 5/02255; H04N 9/31; H04N 9/3161; H04N 9/3129
See application file for complete search history.

(56) References Cited

U.S. PATENT DOCUMENTS

| | | | | |
|---|---|---|---|---|
| 11,152,758 B2* | 10/2021 | Miura | ................ | H01S 5/02326 |
| 11,189,987 B2* | 11/2021 | Miura | .................. | H01S 5/4081 |
| 11,271,362 B2* | 3/2022 | Chen | ................... | H01S 5/02257 |
| 11,353,726 B2* | 6/2022 | Behringer | ............... | H01S 5/141 |
| 2012/0189306 A1* | 7/2012 | Du | ...................... | H01S 5/02251 398/65 |
| 2012/0189314 A1* | 7/2012 | Xu | ........................ | G02B 6/4215 53/477 |
| 2013/0329397 A1* | 12/2013 | Shimizu | ................... | F21V 7/26 362/84 |
| 2015/0316234 A1 | 11/2015 | Samonji et al. | | |

FOREIGN PATENT DOCUMENTS

| | | |
|---|---|---|
| WO | 2010069282 A2 | 6/2010 |
| WO | 2020074664 A1 | 4/2020 |
| WO | 2020212221 A1 | 10/2020 |

* cited by examiner

*Primary Examiner* — William C. Dowling
(74) *Attorney, Agent, or Firm* — MH2 Technology Law Group, LLP (57) ABSTRACT

Provided is an optoelectronic light source that includes a plurality of semiconductor lasers each configured to emit a laser beam and arranged on a mounting platform, and a redirecting optical element configured to redirect the laser beams. The redirecting optical element includes for each one of the plurality of semiconductor lasers a separate reflection zone, the reflection zones are shaped differently from one another, and after passing the redirecting optical element, the laser beams run in a common plane.

22 Claims, 7 Drawing Sheets

OPTOELECTRONIC LIGHT SOURCE AND DATA GLASSES

FIELD

An optoelectronic light source is provided. Data glasses comprising such an optoelectronic light source are also provided.

BACKGROUND

Documents WO 2020/212221 A1 and WO 2010/069282 A2 refer to arrangements of semiconductor lasers.

SUMMARY

An object to be achieved is to provide an optoelectronic light source that has improved beam combination characteristics.

This object is achieved, inter alia, by an optoelectronic light source and by data glasses as defined in the independent patent claims. Exemplary further developments constitute the subject-matter of the dependent claims.

In particular, the optoelectronic light source comprises a plurality of semiconductor lasers, the laser beams of which are formed, instance collimated or focused, by a common reflective optical element that may be formed of a metallic monolithic block arranged close to the semiconductor lasers. Moreover, an AR/VR engine comprises such an optoelectronic light source with corresponding reflective free beam optics. In this context, AR means augmented reality, and VR stands for virtual reality.

For example, herein an approach for a µ-projection light engine as it could be used in AR/VR data glasses is described. The described configuration combines a small form factor with a high optical efficiency. The key components thereof can be produced by low cost and high volume production technologies, like stamping and/or coining. The number of required optical elements can be minimized. Both aspects may lead to low manufacturing cost.

The optoelectronic light source described herein may especially be used for data glasses like AR/VR data glasses. For this kind of product, the overall size of the product is an essential topic and key performance indicator, KPI. One way to realize compact systems is in this context the so-called flying spot laser beam, FSLB, approach, also referred to as laser beam scanning, LBS. The image in this case is realized by a laser beam or a plurality of laser beams which are deflected by at least one MEMS mirror.

Such a MEMS mirror needs to be illuminated by a laser beam, for instance by a collimated or a focused laser beam. In a monochromatic glasses architecture, this can be just one laser beam, or it can be a plurality of laser beams with slight wavelength offsets for suppression of optical artifacts in the generated images. The effect behind that is a virtual widening of the emission spectrum by sequentially overlapping slightly different wavelength spectra of one wavelength. In an RGB full color configuration this is an overlap of a red, green and blue laser beam, for example, collimated or focused laser beam. Alternatively, also an overlap of a plurality of red, green and blue laser beams is feasible.

In at least on embodiment, the optoelectronic light source comprises:
 a plurality of semiconductor lasers each configured to emit a laser beam and arranged on a mounting platform, and
 a redirecting optical element configured to redirect the laser beams,
 wherein
 the redirecting optical element comprises for each one of the plurality of semiconductor lasers a separate reflection zone, the reflection zones are shaped differently from one another, and
 after passing the redirecting optical element, the laser beams run in a common plane. For example, the reflection zones are configured to shape, for instance to collimate or focus the respective laser beam.

With this optoelectronic light source, for example, the technical problems related to laser beam shaping and the overlap of the emission from the individual semiconductor laser emitters can be solved. This can be done in an efficient, precise, compact and cost-effective way.

Typical boundary conditions are, for example:
 the laser beams, for instance the collimated laser beams, have a diameter of about 1 mm, for example, at least 0.5 mm and/or at most 3 mm;
 a target beam shape is round, in particular, circular;
 a target beam profile is of the flat top type;
 a target inclination angle in-between individual laser beams, for instance collimated or focused laser beams on, for example, the MEMS mirror is approximately 5° or smaller, in particular at most 3° or at most 1.5°;
 all laser beam inclinations lay in one plane; by that, the beam inclination can be compensated for electronically by mirror/laser synchronization, also referred to as bore-sight correction.

Alternative solutions are the usage of dichroic beam combiners, freely propagating beam combination by means of dichroic mirrors, or packing emission spots as close as possible in one plane, either by sub-assemblies which goes down to a typical range of 300 µm to 500 µm by using multi-ridge laser emitter dies where the pitch of the emission points can go down to, for example, 5 µm to 10 µm.

The laser beam shaping, for instance the focusing of laser beam or the collimating of laser beam, can be done with a single lens, for example, an achromatic system, whereas the laser beam inclination offset is corrected electronically. Moreover, free beam configurations with lenses may be used, or planar light combiner, PLC, elements. Such PLC elements comprise a monolithic integrated waveguide which is guiding the laser light based on total internal reflection, TIR, effects.

In the optoelectronic light source described herein, the use of mirrors for the beam shaping is proposed. The mirror surfaces can be arranged in a monolithic block. The monolithic mirror block can be an element of the laser housing. Typically, short wavelength semiconductor lasers need to be packaged hermetically to ensure the live time requirements under all environmental operation conditions. In this case, the mirror block can form the side wall of the package, or can be one component of the side wall of the package. For purposes of consistent terminology, such mirrors or redirecting optical element may also be called deflecting mirrors.

An optical surfaces of the mirrors can have an inclination relative to each other. By that, the laser beams, for instance the reflected, focused or collimated laser beams, can be guided to a common point where they are overlapped to one spot. In the described data glasses, this may be the position where an imaging unit, like the MEMS mirror for the laser beam scanning, LBS, configuration is placed. The inclined laser beams are all arranged in one plane to enable an electronic correction of the beam inclination by the synchronization of a one-dimensional mirror with the lasers.

The optical shape of the mirrors can be spherical, aspherical or can have free form optics. The mirror can redistribute and shape the typical elliptical emission of a semiconductor laser with the high beam divergency to a collimated or focused round beam. For the application in AR/VR data glasses, the formation of a flat top beam profile may be beneficial.

The use of reflective elements for the beam shaping offers a high optical efficiency due to low losses on the reflective element and due to the high numerical aperture of a mirror. Compared to the losses of other solutions by beam clipping, losses on dichroic filter layers, coupling losses and Fresnel losses, the reflective concept described herein offers a much higher optical efficiency. Beside of that, laser beam shaping and beam combination can be realized by just one optical element. The described optical element, that is, the redirecting optical element, can be manufactured by cost effective stamping and coining processes in metal, for example.

According to at least one embodiment, the semiconductor lasers are configured to emit near ultraviolet, visible and/or near infrared radiation. For this purpose, the semiconductor lasers may comprise a semiconductor layer sequence. The semiconductor layer sequence may comprise one or a plurality of active regions, wherein the active region, or each one of the active regions, include at least one quantum well. The quantum well may be a quantum dot, a quantum line, or a quantum layer, or combinations thereof.

According to at least one embodiment, the semiconductor layer sequence is based on a III-V compound semiconductor material. The semiconductor material is for example a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein in each case $0 \leq n \leq 1$, $0 \leq m \leq 1$ and $n+m \leq 1$ applies. The semiconductor layer sequence may comprise dopants and additional constituents. For simplicity's sake, however, only the essential constituents of the crystal lattice of the semiconductor layer sequence are indicated, i.e. Al, As, Ga, In, N or P, even if these may in part be replaced and/or supplemented by small quantities of further substances. The semiconductor layer sequence is particularly preferably based on the AlInGaN material system.

According to at least one embodiment, the redirecting optical element comprises for each one of the plurality of semiconductor lasers a separate reflection zone. In particular, the reflection zones are exclusively assigned to only one of the laser beams in each case. The reflection zone may directly adjoin one another and may be separated from each other, for example, by means of a ridge or a burr or a flash. By means of such a ridge or burr or flash, a kink or break may result between the reflection zones so that accidently impinging laser radiation from a not assigned semiconductor laser is deflected away and preferably hindered from leaving the optoelectronic light source.

According to at least one embodiment, the reflection zones are shaped differently from one another. This does not exclude that different reflection zones are shaped in a mirror-symmetric manner with respect to one another. Thus, each laser beam can be shaped or collimated or focused individually by means of the different reflection zones.

According to at least one embodiment, the reflection zones are configured to shape, for instance to collimate or to form the respectively assigned laser beam. That is, an angle of divergence is reduced by means of the respective reflection zone. The respective laser beam may be a parallel bundle of rays or may be convergent to a point within or without the housing of the optoelectronic light source, or may still diverge with a considerable smaller angle of divergence.

According to at least one embodiment, after passing the redirecting optical element, the laser beams run in a common plane. This applies in particular for beam axes of the laser beams. Moreover, this may apply with a tolerance of at most 2° or of at most 1° or of at most 0.5°.

According to at least one embodiment, the redirecting optical element is a deflecting optical element. Hence, the redirecting optical element may be impermeable for the laser beams, and no laser radiation can travel through the redirecting optical element.

According to at least one embodiment, the redirecting optical element is or comprises a monolithic mirror block. All the reflection zones may be formed in the monolithic mirror block, for example, by stamping or coining or pressing. It is possible that all the reflection zones are located on a single beam shaping side of the redirecting optical element facing the plurality of semiconductor lasers.

According to at least one embodiment, the laser beams run in parallel with one other before impinging on the redirecting optical element. This may apply with a tolerance of at most 30° or of at most 10° or of at most 5° or of at most 2° or of at most 1°.

According to at least one embodiment, the laser beams run in an inclined manner after being reflected at the redirecting optical element, in particular immediately after being reflected at the redirecting optical element. Hence, a distance between the laser beams decreases along a path of the laser beams, at least immediately after the redirecting optical element, and, for example, as far as an imaging unit.

According to at least one embodiment, the laser beams run towards a common crossing point after being reflected at the redirecting optical element. Said single crossing point may be located within the housing, that is, between the redirecting optical element and a cover top side of the cover facing away from the plurality of semiconductor lasers.

According to at least one embodiment, a change in direction of the laser beams at the redirecting optical element is at least 60° or at least 80° and/or is at most 120°. Thus, the change in direction is about a right angle. Because after the redirecting optical element may run in an inclined manner towards each other, said change in direction may be larger than 90°.

According to at least one embodiment, the optoelectronic light source further comprises a housing. Preferably, the housing is air-tight. Hence, a live time of the semiconductor lasers which are arranged in the housing can be increased. Further, the reflection zones of the redirecting optical element may also be located within the housing so that the reflection zones can be protected from corrosion and pollution.

According to at least one embodiment, the housing includes a base plate, a housing ring and a cover. The housing ring is preferably located between the base plate and the cover. The mounting platform is preferably also located within the housing. For example, the mounting platform is an additional part in the housing, or the mounting platform can be an integral part of the base plate, like a step in the base plate.

According to at least one embodiment, the redirecting optical element is part of the housing ring. In this case, the housing ring can be a metallic ring. As an alternative, the housing ring comprises a non-metallic base material which is coated with at least one metal to become the mirror, or is coated with a dielectric mirror, or with a combination of a dielectric mirror and at least one metal. Such reflection-enhancing coatings may also be present on a metallic ring.

According to at least one embodiment, the housing ring comprises an outer ring on a side remote from the plurality of semiconductor lasers and an inner ring facing the plurality of semiconductor lasers. For example, at least one of the outer ring and the inner ring are metallic rings. Preferably, the inner ring is of a softer material than the outer ring. In this case it is possible that the redirecting optical element forms the inner ring or is an integral part of the inner ring.

According to at least one embodiment, the cover is transmissive for the laser beams. For example, the cover is of a glass or of a light-transmissive material like sapphire. To enhance transmission, the cover may be provided with an optical coating like an antireflective coating.

According to at least one embodiment, the cover has a further optical element. Hence, the cover is configured to at least one of: changing a direction of at least one of the laser beams, and combining at least two of the laser beams. If the cover is only a plane-parallel plate, then only an offset of the beams occurs, but no change in direction; that is, prior to impinging on and after passing the cover, in case of a plane-parallel plate, directions of the respective laser beam are in parallel with each other.

According to at least one embodiment, the further optical element comprises or is an optical grating for at least one of the laser beams. It is possible that there is at least on grating on each main side of the cover.

According to at least one embodiment, the further optical element comprises or is a light guide for at least two of the laser beams.

According to at least one embodiment, the further optical element comprises or is a meta-optical element for at least one of the laser beams. The term 'meta-optical' means, for example, that said element comprises in particular repeating structural units with a structural size below the wavelength of the laser beams or below 50% of said wavelength.

According to at least one embodiment, a common focal point of the laser beams is located between the redirecting optical element and a cover top side of the cover facing away from the plurality of semiconductor lasers. For example, the common focal point is located within the cover.

According to at least one embodiment, the laser beams are combined within the cover. For example, in this case the cover comprises the at least one light guide, or comprises the at least one meta-optical element.

According to at least one embodiment, beam diameters of the laser beams at the reflection zones amount to at least 0.6 mm or to at least 1.0 mm or to at least 1.5 mm. By means of such comparably large beam diameters, the redirecting optical element can be configured to shape, for instance to collimate or to form the laser beams with a low remaining divergence angle. For example, the remaining divergence angle is at most 5° or at most 2° or at most 1°. As an option, the laser beam diameters at the reflection zones amount to at most 3 mm or to at most 2 mm or to at most 1.5 mm.

According to at least one embodiment, the plurality of semiconductor lasers is composed of three or more than three lasers and includes at least one laser to emit blue light, at least one laser to emit green light and at least one laser to emit red light. Hence, the optoelectronic light source can be an RGB light source.

According to at least one embodiment, the semiconductor lasers are arranged next to one another, seen in top view of the mounting platform. For example, a distance between the semiconductor lasers is at least 0.1 mm and/or at most 0.7 mm.

According to at least one embodiment, a plane of mirror symmetry of the redirecting optical element runs through a central one of the semiconductor lasers, or between two middle ones of the semiconductor lasers, depending if there is an odd or even number of semiconductor lasers.

According to at least one embodiment, each semiconductor lasers in the plurality of semiconductor lasers is an edge emitting laser. In this case, emission regions of the semiconductor lasers can be located on a side of the semiconductor lasers facing the mounting platform.

According to at least one embodiment, the mounting platform is a submount. In particular, the mounting platform is a common submount for all the semiconductor lasers.

Data glasses are additionally provided. The data glasses may comprise an optoelectronic light source as indicated in connection with at least one of the above-stated embodiments. Features of the data glasses are therefore also disclosed for the optoelectronic light source and vice versa.

In at least one embodiment, the data glasses are configured for virtual or augmented reality applications, and comprise one or a plurality of the optoelectronic light sources described above, as well as at least one imaging unit downstream of the at least one optoelectronic light source, and at least one picture-making element downstream of the at least one imaging unit. The at least one optoelectronic light source is configured to illuminate the at least one picture-making element by means of the at least one imaging unit so that a picture or a video can be produced by and/or projected onto the at least one picture-making element. For example, the at least one picture-making element is a screen or a two-dimensional waveguide or a holographic mirror. There can be relay optics between the imaging unit and the at least one assigned picture-making element.

According to at least one embodiment, the imaging unit is a microelectromechanical system, MEMS, mirror. It is possible that zero state deflections of the MEMS mirror are different for each one of the laser beams. Hence, different angles of the laser beams toward the imaging unit can be compensated for.

According to at least one embodiment, the imaging unit comprises at least one liquid crystal on silicon, LCoS, element. For example, there is one common LCoS element for all the semiconductor lasers, or there is one LCoS element per semiconductor laser.

According to at least one embodiment, a first optical distance between the plurality of semiconductor lasers and the redirecting optical element is at least 0.3 mm or at least 0.5 mm or at least 0.8 mm. Alternatively or additionally, said first optical distance is at most 5 mm or at most 3 mm or at most 1.5 mm.

According to at least one embodiment, a first optical distance between the optoelectronic light source and the imaging unit is at least 2 mm or at least 5 mm or at least 10 mm. Alternatively or additionally, said first optical distance is at most 10 cm or at most 5 cm or at most 25 mm.

An optoelectronic light source and data glasses described herein are explained in greater detail below by way of exemplary embodiments with reference to the drawings. Elements which are the same in the individual figures are indicated with the same reference numerals. The relationships between the elements are not shown to scale, however,

DETAILED DESCRIPTION

Figure 1:
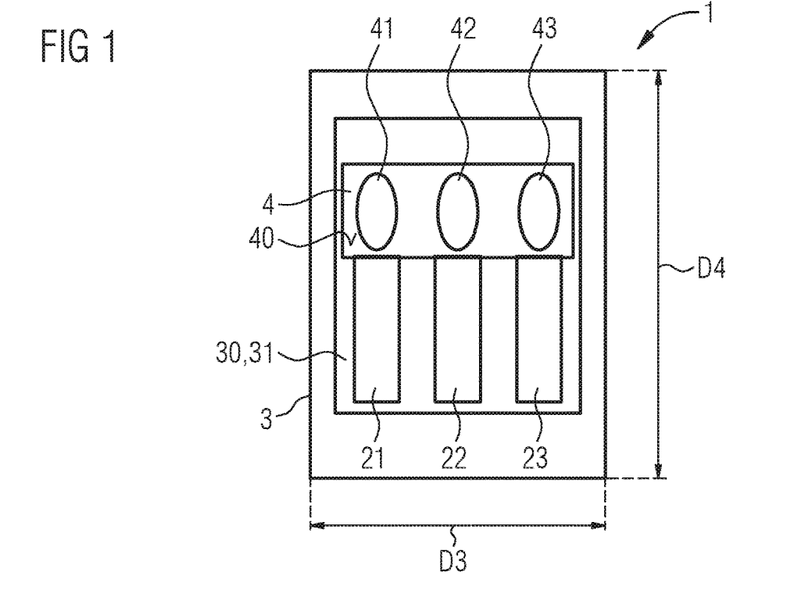
FIG. 1 is a schematic top view of an exemplary embodiment of an optoelectronic light source described herein.
Figure 2:
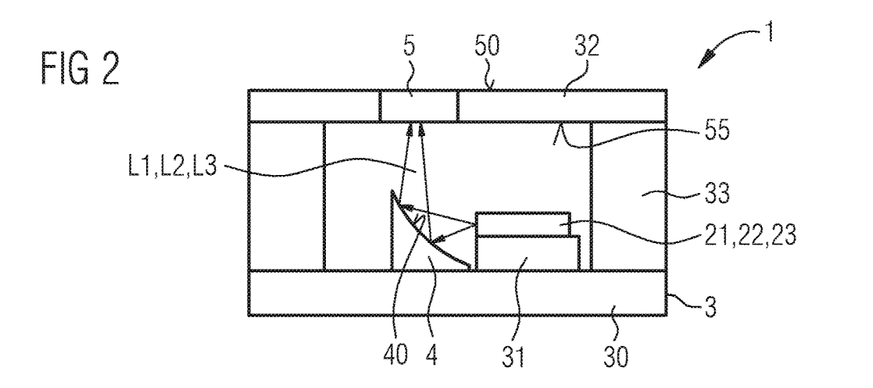
FIGS. 2 to 4 are schematic sectional views of exemplary embodiments of optoelectronic light sources described herein.

FIGS. 1 and 2 illustrate an exemplary embodiment of an optoelectronic light source 1. The optoelectronic light source 1 comprises a plurality of semiconductor layers, for example, three lasers 21, 22, 23 configured to emit red, green and blue laser beams L1, L2, L3, respectively. The lasers 21, 22, 23 are arranged on a common mounting platform 31 which is, for example, a submount.

Further, the optoelectronic light source 1 comprises a redirecting optical element 4 having a beam shaping side 40 facing the lasers 21, 22, 23. The beam shaping side 40 has a first reflection zone 41, a second reflection zone 42 and a first reflection zone 43 to shape, for instance to collimate or to form the laser beams L1, L2, L3. For each one of the laser beams L1, L2, L3, a separate reflection zone 41, 42, 43 is provided.

The laser beams L1, L2, L3 leave the lasers 21, 22, 23 at an edge near the mounting platform 31 and diverge. The lasers 21, 22, 23 can be mounted in parallel with each other on the mounting platform 31. By means of the redirecting optical element 4, the laser beams L1, L2, L3 are shaped, for instance are collimated to become focused laser beams L1, L2, L3 that can meet in one common crossing point. Accordingly, the reflection zone 41, 42, 43 are curved similar to paraboloids.

As an option, the optoelectronic light source 1 further comprises a housing 3. The housing 3 may comprise a base plate 30 on which the mounting platform 31 can be located, and a housing ring 33 around the lasers 21, 22, 23 and the redirecting optical element 4, and a cover 32 atop the lasers 21, 22, 23.

For example, a length D4 of the housing 3 is at least 2 mm and/or is at most 10 mm or at most 5 mm. Alternatively or additionally, a width D3 of the housing 3 is at least 0.9 mm or at least 1.5 mm and/or is at most 8 mm or at most 4 mm.

Moreover, the cover 32 may comprise a further optical element 5 to shape and/or to combine the laser beams L1, L2, L3. The further optical element 5 may be integrated in the cover 5 and may run from an inner side 55 to a cover top side 50. For example, the laser beams L1, L2, L3 have a common focal point at or near the inner side 55, or within the cover 32.

Figure 3:
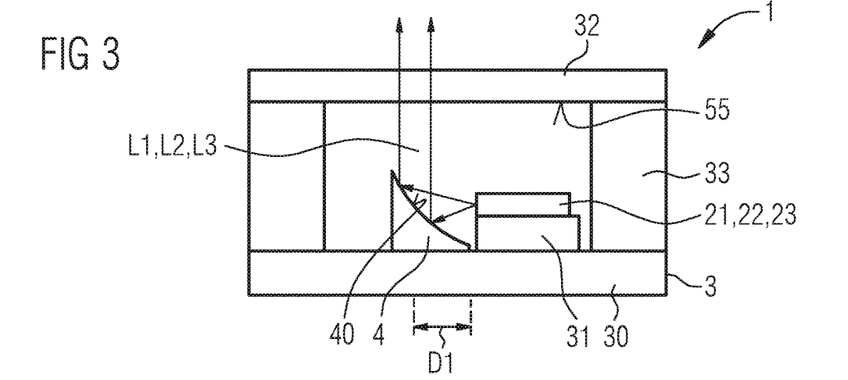

In FIG. 3, it is shown that the redirecting optical element 4 can also shape, in particular to collimate the laser beams L1, L2, L3 to become parallel laser ray bundles. Otherwise, the same as to FIGS. 1 and 2 may also apply to FIG. 3.

Figure 4:
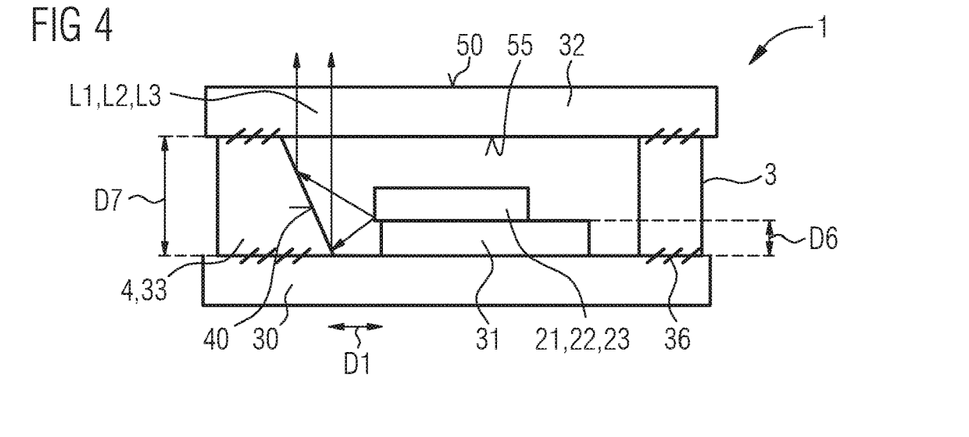
Figure 5:
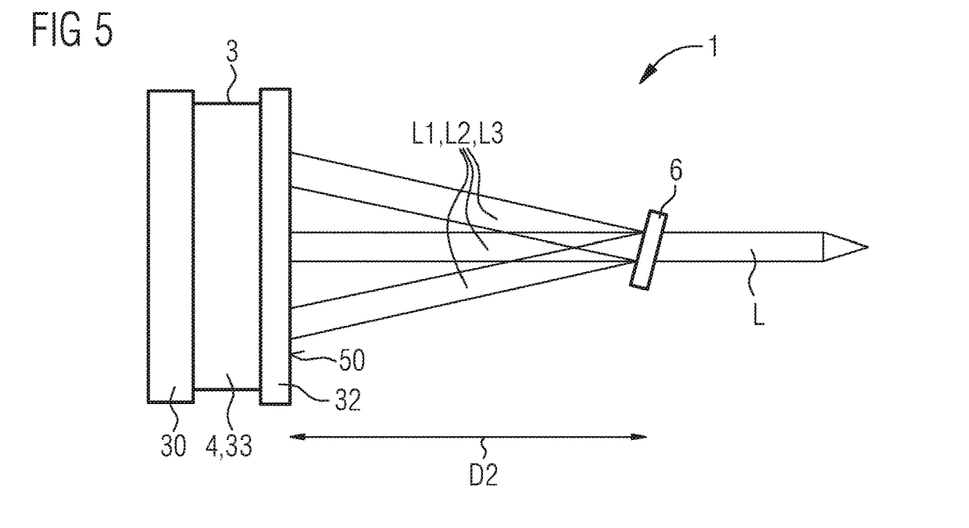
FIG. 5 is a schematic side view of the optoelectronic light source of FIG. 4.

In FIGS. 4 and 5, another embodiment of the optoelectronic light source 1 is shown. In this optoelectronic light source 1, the housing ring 3 includes the redirecting optical element 4. Moreover, it is shown that the laser beams L1, L2, L3 are parallel bundles of rays that run in a common plane to an imaging unit 6 which is, for example, a MEMS mirror. The different angles of incidence may electronically be corrected by a color-dependent zero-state of the imaging unit 6.

For example, a first optical distance D1 between the lasers 21, 22, 23 and the beam shaping side 40 of the redirecting optical element 4 is about 1 mm. Alternatively or additionally, a second optical distance D2 between the cover top side 50 and the imaging unit 6, that is, the common crossing point of the laser beams L1, L2, L3, is at least 4 mm or at least 8 mm and/or is at most 5 cm or at most 3 cm. A diameter of the laser beams L1, L2, L3 after passing through the cover 32 is, for example, at least 0.6 mm and/or at most 1.5 mm, for example, 0.9 mm. An angle of divergence of the laser beams L1, L2, L3 outside the housing 3 is, for example, at most 5° or at most 2°. Preferably, the laser beams L1, L2, L3 are of a round and flat top profile. These values could individually or collectively apply to all other exemplary embodiments, too.

Further, according to FIG. 4, the cover 32, the housing ring 33 and the base plate 30 may be connected by means of a connection means 36, like a solder or a metallization. This may particularly be true if the cover 32, the housing ring 33 and the base plate 30 are metallic compounds or comprise at least one metallization configured, for example, for soldering.

Otherwise, the same as to FIGS. 1 to 3 may also apply to FIGS. 4 and 5.

Hence, in the exemplary embodiments described herein the redirecting optical element 4 may be referred to as a deflecting mirror that is designed to tilt the laser beams L1, L2, L3 from the, for example, three RGB lasers 21, 22, 23 to a common point at the imaging unit 6 which is, for example, a MEMS mirror of an AR/VR system. The reflection zones 41, 42, 43 can be designed to shape, for instance to tilt and collimate or focus the incident elliptical laser beams L1, L2, L3 coming from each laser 21, 22, 23. The imaging unit 6 can accommodate for the different inclination angles of the laser beams by means of software, where the MEMS mirror "zero" state deflection is different for each laser color in the image formation process. This may be a bore-sight algorithm used in AR/VR flying spot imaging systems.

The housing 3, also referred to as package, may be based on an AlN substrate for the base plate 30, the housing ring 33 as a deflecting mirror packaging, and the cover 32 as a final output window. The entire package may be hermitically sealed. The optional further optical element 5 may be refractive, diffractive, or meta-optic and can provide additional functionality such as secondary aberration corrections, beam inclination, beam combining and other functions.

Figure 6:
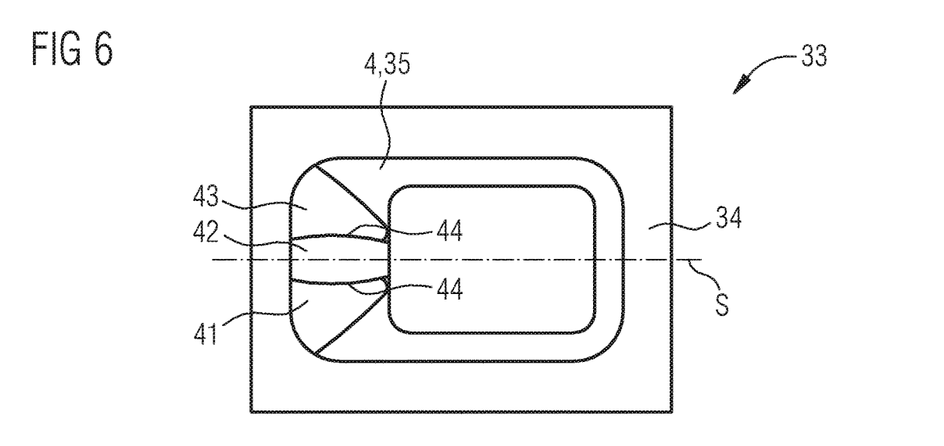
FIG. 6 is a schematic top view of an exemplary embodiment of a redirecting optical element for optoelectronic light sources described herein.

In FIG. 6, an exemplary housing ring 3 is illustrated. The housing ring 33 is composed of an inner ring 35 and an outer ring 34. The outer ring 34 may be of rectangular shape and is, for example, of a metal like an FeNiCo alloy and may be plated with AuSn at least in places. The inner ring 35 is, for example, of a metal like Al and may be stamped to shape the reflection zones 41, 42, 43. At the reflection zone 41, 42, 43, the inner ring 35 may be broader than in remaining regions, seen in top view. There can be an axis S of mirror symmetry running through the central reflection zone 42, seen in top view.

FIGS. 7 to 16 show additional embodiments, whereby the titled laser beams L1, L2, L3 from the reflection zones 41, 42, 43 are combined to form a single or near single RGB combined overall beam L. This removes the need for the bore-sight correction, simplifying operation of a VR/AR system and enhancing the field-of-view.

Figure 7:
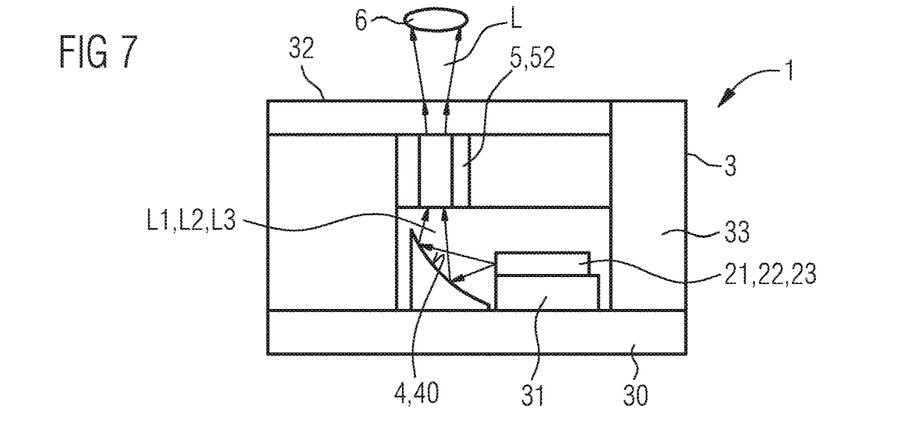
FIG. 7 is a schematic sectional view of an exemplary embodiment of an optoelectronic light source described herein.
Figure 8:
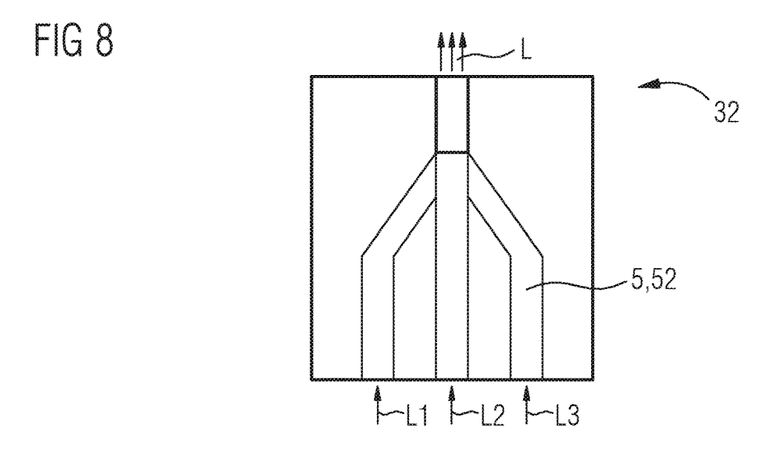
FIG. 8 is a schematic sectional view of the cover for the optoelectronic light source of FIG. 7.
Figure 9:
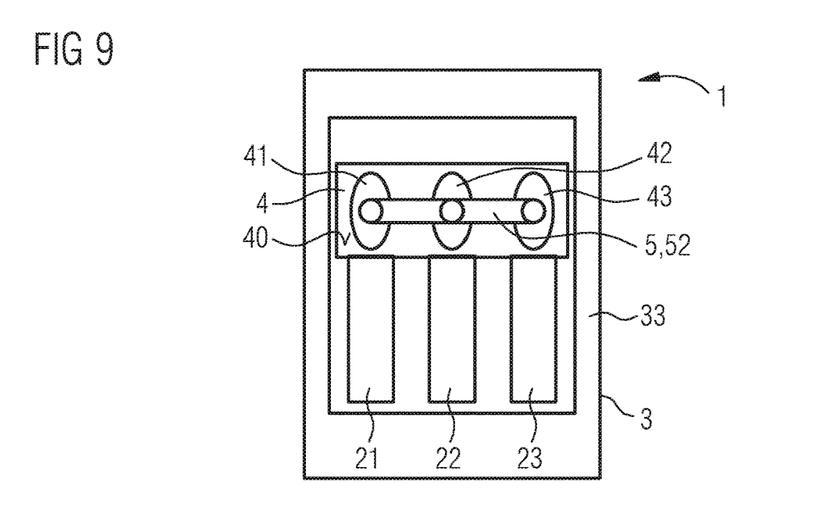
FIG. 9 is a schematic top view of the optoelectronic light source of FIG. 7.

According to FIGS. 7 to 9, the redirecting optical element 4 provides focused spots of the laser beams L1, L2, L3 at input faces of three waveguide structures of a light guide 52 of the further optical element 5. The waveguides then come to a combiner region, providing a single emission region. The waveguide structures are, for example, formed in a low refractive index glass that can be sealed hermetically to the housing ring 33 and/or to the cover 32. Hermetically may mean that a leakage rate is at most $5 \times 10^{-8}$ atm cm$^3$ s$^{-1}$, for example, measured according to the Mil standard MIL-Std 883.

The waveguide structures can be formed by ion-exchange processes, for example. The cover 32 may be applied on top of a portion of the housing ring 33 comprising the light guide 52.

Otherwise, the same as to FIGS. 1 to 6 may also apply to FIGS. 7 to 9.

Figure 10:
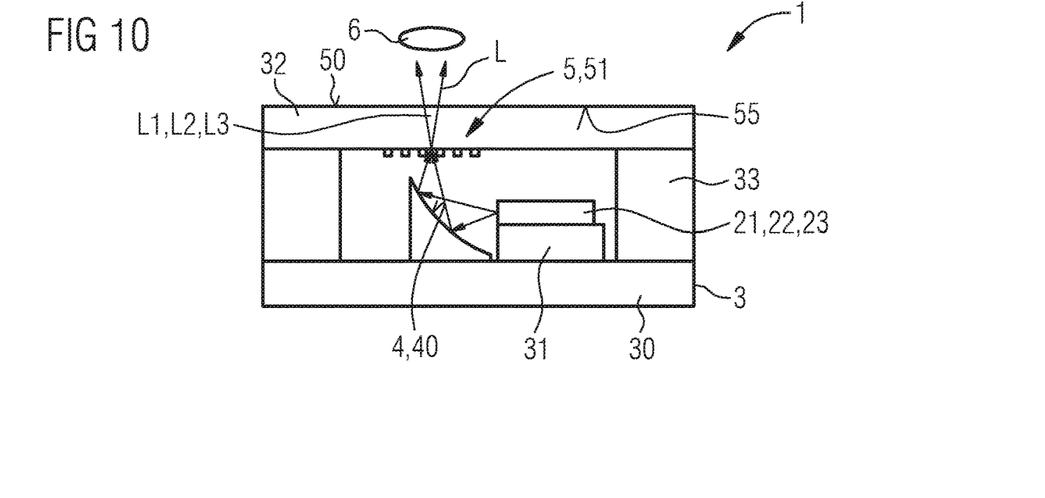
FIG. 10 is a schematic sectional view of an exemplary embodiment of an optoelectronic light source described herein.
Figure 11:
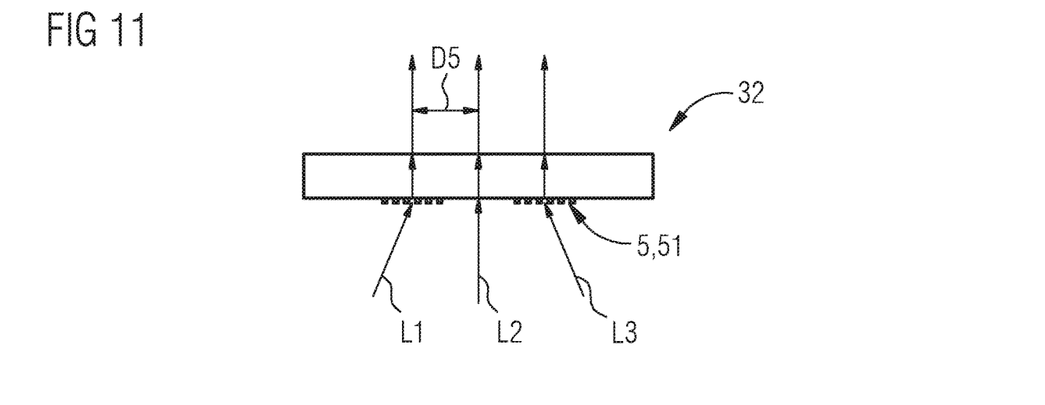
FIG. 11 is a schematic sectional view of the cover for the optoelectronic light source of FIG. 10.

FIGS. 10 and 11 show an embodiment of an alternative partial beam combining method whereby optical grating 51 are applied as the further optical element 5 on the inner side 55 of the cover 32; the cover top side 50 may be free of any optical grating. Each grating structure is separately optimized to diffract a high fraction of, for example, the red and blue laser beams L1, L3 coming from the redirecting optical element 4. By adjusting the period of the gratings, the deflected beams can be made to diffract in a vertical direction, so that all laser beams L1, L2, L3 are emitted in parallel.

By designing the reflection zones 41, 42, 43 to provide a tightly focused spot near the inner side 55 of the glass cover 32, a distance D5 between adjacent laser beams L1, L2, L3 at the top side 50 can be very small, see FIG. 11, and may be, for example, between 20 μm and 50 μm inclusive, provided that focused spot diameters are on the order of 5 μm to 10 μm inclusive. The grating structures can further be optimized to diffract these focused beams. The result is that emitted diverging beams come from focal spots within some tens of μm of each other.

The reflection zones 41, 42, 43 may also be optimized to have the secondary foci of each laser occur at the approximately same vertical position within or near the cover 32. This provides three beams coming from almost the same position and having identical vertical placement of the secondary source positions, which provide considerable flexibility for the designer of an AR system. Furthermore, having the secondary focus at the cover 32, provides additional flexibility for the external optics placement in an AR system.

Otherwise, the same as to FIGS. 1 to 9 may also apply to FIGS. 10 and 11.

Figure 12:
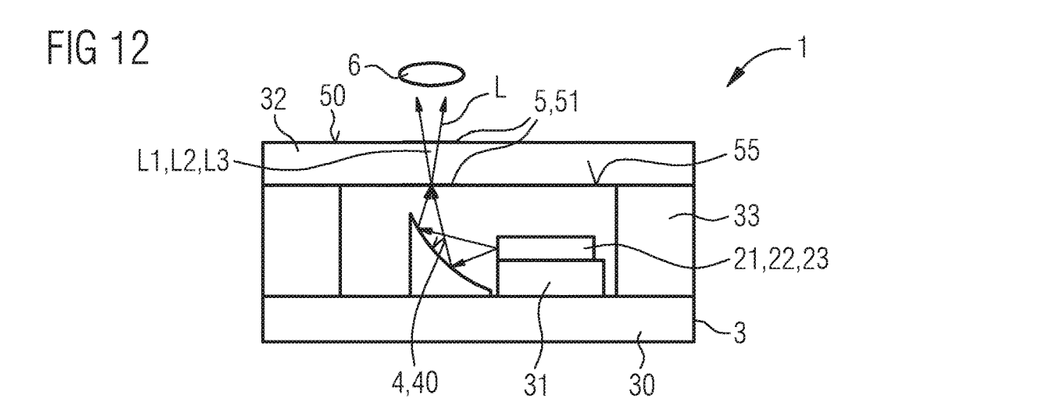
FIG. 12 is a schematic sectional view of an exemplary embodiment of an optoelectronic light source described herein.
Figure 13:
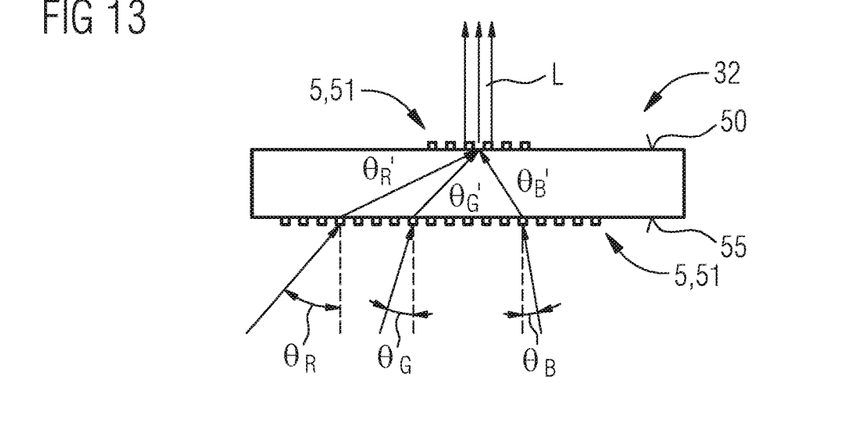
FIGS. 13 and 14 are a schematic sectional views of covers for the optoelectronic light source of FIG. 12.
Figure 14:
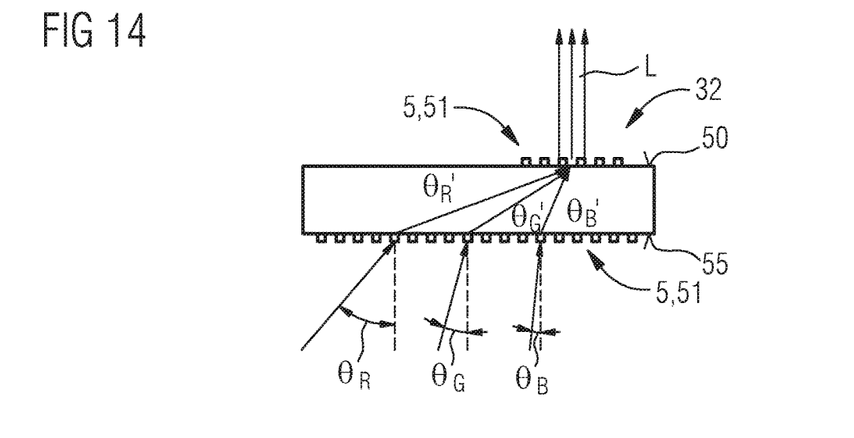

FIGS. 12 to 14 show yet another embodiment based on grating deflector concepts. In this case, the optical gratings 52 are on the inners side 55 and on the top side 50 of the cover 32. The laser beams L1, L2, L3 from the redirecting optical element 4 are adjusted to be incident on the three bottom side gratings at specific angles θR, θG, θB for red, green and blue light, for example. These angles are adjusted such that the individual gratings can deflect each laser beam L1, L2, L3 to the same location on the top side 50 of the cover 32.

Furthermore, these deflected angles inside the cover 32, θR', θG', θB', are such that they are all re-diffracted to the same emission angle in the −1 order of the output grating. For emission of parallel beams, the following condition should be met: $\sin \theta'_j = \lambda_j / n_s \Lambda$. Here, $\theta_j'$ is the angle of the j=R, G, or B beam within the cover, incident on the top grating, $\lambda_j$ is the wavelength of the respective beams, and $\Lambda$ is the period of the top grating; $n_s$ refers to the refractive index of the cover 32.

For the embodiments in FIGS. 10 to 14, the optical gratings 51 can be fabricated by several methods. Possible production methods include DUV lithography and nano-imprint of resist structures followed by etching of the cover 32, or more preferably, a high refractive index coating on either side of the cover 32, not shown. Alternatively, one can use a lift-off procedure with both types of lithography, whereby a coating is applied to a developed resist pattern that is the negative of the desired waveguide patterns. Finally, one can also fabricate highly optimized grating structures by using meta-optic structures.

According to FIG. 13, the grating structure at the top side 50 is located at a center portion, for example, atop the middle grating structure at the inner side 55. Otherwise, see FIG. 14, the grating structure at the top side 50 is located at a border portion, for example, atop the right-most grating structure at the inner side 55. By varying the position of the grating structure at the top side 50, the grating structures can be simplified and all angles θR, θG, θB, θR', θG', θB' may have the same sign, like in FIG. 14.

Otherwise, the same as to FIGS. 1 to 11 may also apply to FIGS. 12 to 14.

Figure 15:
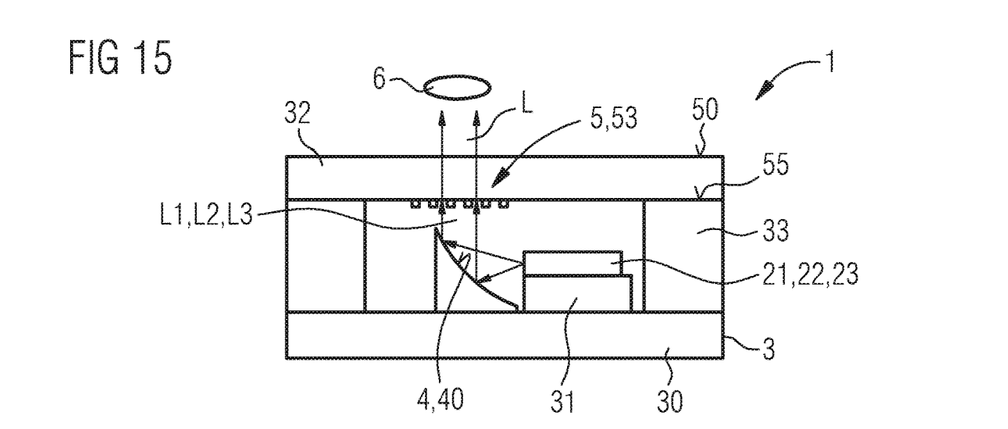
FIG. 15 is a schematic sectional view of an exemplary embodiment of an optoelectronic light source described herein.
Figure 16:
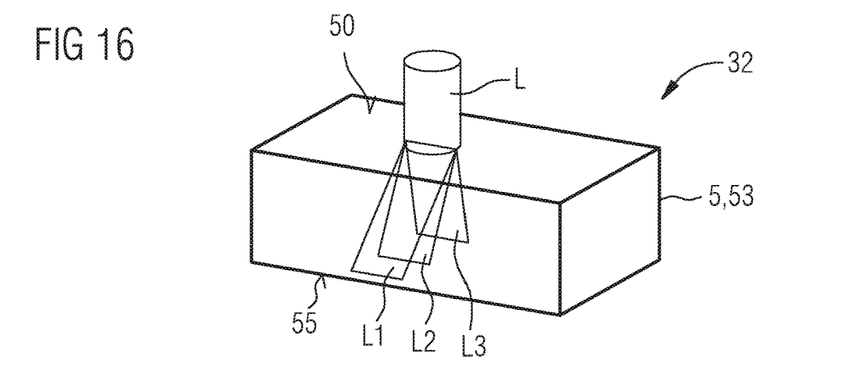
FIG. 16 is a schematic perspective view of the cover for the optoelectronic light source of FIG. 15.

FIGS. 15 and 16 show a full application of meta-optic technology to form a chromatic beam combining structure. Here, the structure makes use of meta-optic elements 53 as the further optical element 5 which combines the functions of the three different gratings 51 of FIGS. 13 and 14 in one. For example, the meta-structure may be optimized to diffract the red beam into the −1 order, the green beam into the 0 order and the blue beam into the +1 order, to give a fully overlapping and parallel beam output. The design of the meta-optic elements 53 can be accomplished by optimization schemes including adjoint state topological optimization methods.

Otherwise, the same as to FIGS. 1 to 14 may also apply to FIGS. 15 and 16.

Figure 17:
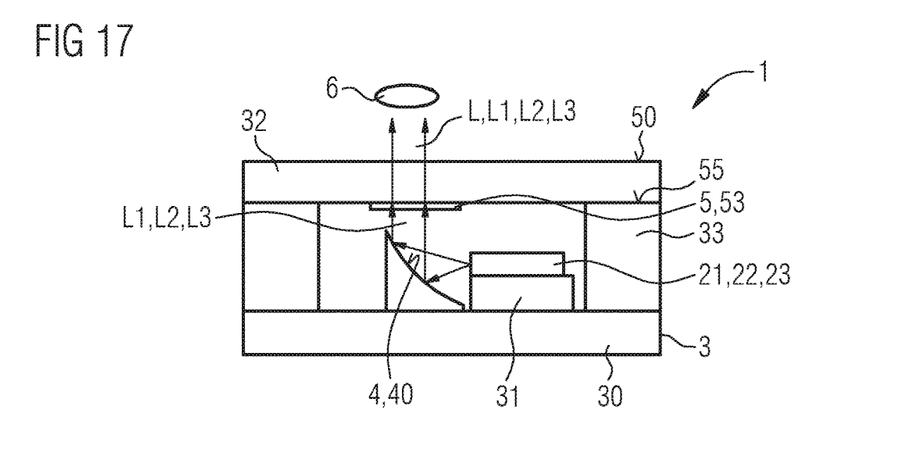
FIG. 17 is a schematic sectional view of an exemplary embodiment of an optoelectronic light source described herein.

Further, FIG. 17 shows another embodiment that employs the deflecting mirrors and meta-lens technology. Here, the redirecting optical element 4 provides a simpler function of weakly focusing the fast laser axis only so that both fast and slow axes have the same width at the location of the meta-optical element 53 for each laser beam L1, L2, L3. The meta-optical element 53 then uses an astigmatic design to generate circular beams.

The meta-optical element 53 has considerable flexibility to accommodate desired AR/VR optical system design. It could be designed to shape the laser beams, for example, to create three collinear collimated beams, three inclined collimated beams, or three focused beams that merge at a desired intermediate image plane in the scanning AR/VR optical system. Furthermore, each meta-lens can be optimized for each wavelength and field aberrations or astigmatism from each laser 21, 22, 23. Additionally, the meta-lens can provide some beam-forming capability, to convert the more Gaussian fields from the lasers 21, 22, 23 to top-hat profiles, for example. This approach, while not providing direct beam combining, offers considerable flexibility in the transformation of the non-ideal laser beams L1, L2, L3 and can be optimized for each RGB laser 21, 22, 23.

Otherwise, the same as to FIGS. 1 to 16 may also apply to FIG. 17.

Figure 18:
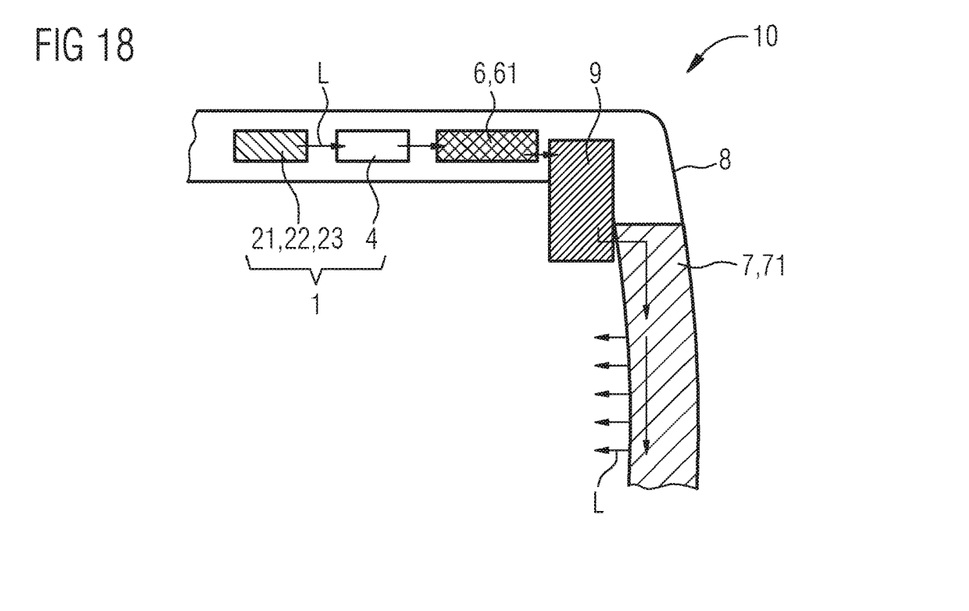
FIGS. 18 and 19 are schematic sectional views of exemplary embodiments of data glasses comprising an optoelectronic light source described herein.
Figure 19:
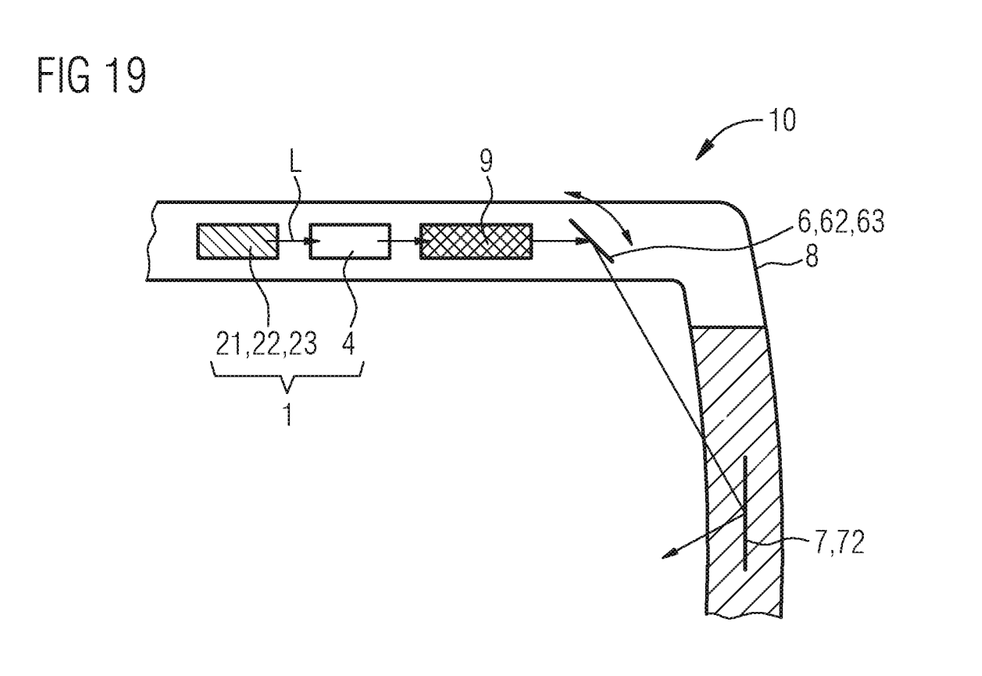

In FIGS. 18 and 19, exemplary embodiments of data glasses 10 are illustrated. The data glasses 10 comprise one or a plurality of the optoelectronic light sources 1 as illustrated, for example, in FIGS. 1 to 17. The data glasses 10 may comprise a casing 8 in which the optoelectronic light source 1 is arranged, for example, in temple portions of the data glasses 10. Because of the casing 8, a common housing for the semiconductor lasers 21, 22, 23 and the redirecting optical element 4 may optionally be omitted; however, to hermetically seal the semiconductor lasers 21, 22, 23, preferably there is such a common housing, not shown in FIGS. 18 and 19.

At a front portion of the casing 8, there may be a picture-making element 7, which could be some kind of screen. The imaging unit 6 may be placed at an end or near an end of the respective temple portion.

According to FIG. 18, the imaging unit 6 to project the overall laser beam L to the picture-making element 7 is a microelectromechanical system 61, MEMS, and the picture-making element 7 is a two-dimensional waveguide 71. Optionally, between the imaging unit 6 and the picture-making element 7 there are relay optics 9, for example, to adapt a diameter of the laser beam L. The same applies to all other exemplary embodiments.

However, the imaging unit 6 can also comprise a liquid crystal on silicon 62, LCoS, which may be a miniaturized reflective active-matrix liquid-crystal display using a liquid crystal layer on top of, for example, a silicon backplane, see FIG. 19.

Further, see also FIG. 19, the picture-making element 7 can be a holographic mirror 72, and the relay optics 9 may be placed between the redirecting optical element 4 and the imaging unit 6. As an option, there is an eye tracking unit 63, like a further MEMS, that may be integrated in the imaging unit 6. Such an eye tracking unit 63 can also be present in all other exemplary embodiments.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

We claim:

1. An optoelectronic light source comprising:
   a plurality of semiconductor lasers each configured to emit a laser beam and arranged on a mounting platform, and
   a redirecting optical element configured to redirect the laser beams, wherein
      the redirecting optical element comprises for each one of the plurality of semiconductor lasers a separate reflection zone,
      after passing the redirecting optical element, the laser beams run in a common plane, and
      beam diameters of the laser beams at the reflection zones amount to at least 1.0 mm so that the redirecting optical element is configured to collimate or focus the laser beams with a remaining divergence angle of at most 2°.

2. The optoelectronic light source according to claim 1, wherein the reflection zones are configured to collimate, focus or to shape the respectively assigned laser beam.

3. The optoelectronic light source according to claim 1, wherein the redirecting optical element is a deflecting optical element that comprises a monolithic mirror block in which all the reflection zones are formed on a single beam shaping side of the redirecting optical element facing the plurality of semiconductor lasers.

4. The optoelectronic light source according to claim 1, wherein the laser beams run in parallel with one other before impinging on the redirecting optical element, wherein the laser beams run in an inclined manner and towards a common crossing point after being reflected at the redirecting optical element, wherein a change in direction of the laser beams at the redirecting optical element is at least 60° and at most 120°.

5. The optoelectronic light source according to claim 1, further comprising a housing, wherein the housing includes a base plate, a housing ring and a cover, and wherein the housing is air-tight.

6. The optoelectronic light source according to claim 1, wherein the plurality of semiconductor lasers is composed of three lasers and includes one laser to emit blue light, one laser to emit green light and one laser to emit red light, wherein said three lasers are arranged next to one another and a plane of mirror symmetry of the redirecting optical element runs through a central one of said three lasers.

7. The optoelectronic light source according to claim 1, wherein each laser in the plurality of semiconductor lasers is an edge emitting laser, emission regions of the lasers are located on a side of said lasers facing the mounting platform, wherein the mounting platform is a submount.

8. Data glasses for virtual or augmented reality applications, comprising an optoelectronic light source according to claim 1, an imaging unit downstream of the optoelectronic light source, and a picture-making element downstream of the imaging unit, wherein the optoelectronic light source is configured to illuminate the picture-making element by means of the imaging unit so that a picture can be produced by means of the picture-making element.

9. The data glasses of claim 8, wherein the imaging unit is a microelectromechanical system, MEMS, mirror, and wherein zero state deflections of the MEMS mirror are different for each one of the laser beams.

10. The data glasses of claim 8, wherein the imaging unit comprises a liquid crystal on silicon, LCoS, element.

11. The data glasses of claim 8, wherein a first optical distance between the plurality of semiconductor lasers and the redirecting optical element is between 0.5 mm and 3 mm inclusive, wherein a second optical distance between the optoelectronic light source and the imaging unit is between 2 mm and 5 cm inclusive, and wherein the picture-making element is one of a screen, a holographic mirror and a two-dimensional waveguide.

12. An optoelectronic light source comprising:
a plurality of semiconductor lasers each configured to emit a laser beam and arranged on a mounting platform,
a housing, and
a redirecting optical element configured to redirect the laser beams, wherein
the redirecting optical element comprises for each one of the plurality of semiconductor lasers a separate reflection zone,
after passing the redirecting optical element, the laser beams run in a common plane, and
the housing includes a base plate, a housing ring, and a cover, and wherein the housing is air-tight.

13. The optoelectronic light source according to claim 12, wherein the redirecting optical element is part of the housing ring which is a metallic ring.

14. The optoelectronic light source according to claim 12, wherein the housing ring comprises an outer ring on a side remote from the plurality of semiconductor lasers and an inner ring facing the plurality of semiconductor lasers, wherein the outer ring and the inner ring are metallic rings, the inner ring is of a softer metal than the outer ring, and wherein the redirecting optical element forms the inner ring.

15. The optoelectronic light source according to claim 12, wherein the cover is transmissive for the laser beams and has a further optical element so that the cover is configured to at least one of: changing a direction of at least one of the laser beams, and combining at least two of the laser beams.

16. The optoelectronic light source according to claim 15, wherein the further optical element comprises an optical grating for at least one of the laser beams or a light guide for at least two of the laser beams.

17. The optoelectronic light source according to claim 15, wherein the further optical element comprises a meta-optical element for at least one of the laser beams.

18. The optoelectronic light source according to claim 15, wherein a common focal point of the laser beams is located between the redirecting optical element and a cover top side of the cover facing away from the plurality of semiconductor lasers.

19. The optoelectronic light source according to claim 15, wherein the laser beams are combined within the cover.

20. The optoelectronic light source according to claim 15, wherein a common focal point of the laser beams is located outside the housing, wherein the laser beams run in the common plane at least between a cover top side of the cover facing away from the plurality of semiconductor lasers and the common focal point.

21. The optoelectronic light source according to claim 12, wherein beam diameters of the laser beams at the reflection zones amount to at least 1.0 mm so that the redirecting optical element is configured to collimate or focus the laser beams with a remaining divergence angle of at most 2°.

22. An optoelectronic light source comprising:
a plurality of semiconductor lasers each configured to emit a laser beam and arranged on a mounting platform, and
a redirecting optical element configured to redirect the laser beams, wherein
the redirecting optical element comprises for each one of the plurality of semiconductor lasers a separate reflection zone,
after passing the redirecting optical element, the laser beams run in a common plane
each laser in the plurality of semiconductor lasers is an edge emitting laser, emission regions of the lasers are located on a side of said lasers facing the mounting platform, and
the mounting platform is a submount.

* * * * *